United States Patent Office 3,809,591

Patented May 7, 1974

3,809,591

POLYAMIDE-METAL STRUCTURE

Elliot A. Vogelfanger, Edison, and Bennett Nathanson, West Orange, N.J., assignors to Celanese Corporation, New York, N.Y.

No Drawing. Filed Dec. 27, 1971, Ser. No. 212,772
Int. Cl. B32b *15/08, 27/34, 31/22*
U.S. Cl. 156—151 14 Claims

ABSTRACT OF THE DISCLOSURE

A structure comprising a metal substrate laminated to an aromatic polyamide film layer with no adhesive disposed therebetween. The structure is characterized by its ability to withstand temperatures in the range of 500° F. to 550° F. for up to one minute. In addition, processes are disclosed for forming the structure without requiring the use of an adhesive to bond the metal substrate to the polyamide film.

BACKGROUND OF THE DISCLOSURE

Field of the invention

This invention is directed to a structure comprising a metal substrate and an aromatic polyamide film layer disposed thereon and a process for forming said structure. More particularly, the instant invention is directed to an aromatic-polyamide-metal laminate stable at elevated temperatures and capable of being in direct contact with molten solder without distortion for up to one minute.

Description of the prior art

Polymeric materials made of wholly aromatic polyamides have found an increasing market in recent years due to their physical and chemical properties. Aromatic polyamide film, for example, exhibits strong abrasion resistance at elevated temperatures. These films have therefore found important utility in electrical applications which are characterized by high temperature environments. Among the important electrical applications to which aromatic polyamide film has been employed is in the field of printed circuits. A printed circuit comprises a surface of a conducting metal, especially copper, laminated to a plastic nonconducting substrate. Due to the high temperature that these printed circuits are exposed to, especially during soldering of other electric components and connectors, aromatic polyamides have been suggested for use as the plastic substrate. In many instances, however, printed circuits comprising a copper-aromatic polyamide laminate have not been very effective. The failure of these printed circuits has not been caused by any failure of the polyamide film layer to withstand the high temperature environment to which it is subjected. Rather the adhesive bonding the metal layer to the polyamide film has failed at these elevated temperatures. Obviously, printed circuits employing high temperature resistant polyamide substrates would find much greater acceptance and utilization if a laminate could be made which does not include a temperature sensitive adhesive which causes a significant percentage of the failures in the currently available printed circuit market.

Of equal importance, even when an adhesive is employed which withstands the high temperature to which a printed circuit is subjected, is the cost of aromatic polyamide-adhesive-metal laminate. Such a laminate is significantly more expensive than an adhesiveless aromatic polyamide-metal laminate. This is due not only to the material cost of the adhesive, but also to the more complex processing procedure required to produce the adhesive containing laminate.

SUMMARY OF THE INVENTION

The instant invention is directed to a high temperature-resistant aromatic polyamide-metal laminate in which failures due to breakdown at high temperatures of the adhesive bonding the polyamide and metal layers is essentially eliminated. This is accomplished by providing an adhesive-absent metal-polyamide laminate. Not only does such a laminate remove a principal cause of failure in printed circuits, but moreover, such a laminate is cheaper to produce and easier to fabricate. Adhesives of the type normally employed to bond metal to a plastic substrate are a significant material expense in the overall cost of the prior art laminates. Thus, a laminate which eliminates the need of an adhesive lowers significantly the material costs of the final product. In addition, processing is simplified with a resultant lowering in processing costs in the manufacture of the laminate due to the decreased number of processing steps required in the manufacture of the laminate.

In accordance with the instant invention a metal-polyamide laminate is provided which does not include any adhesive to bond the metal and polymer layers. As a result, the metal-polyamide structure of the instant invention, preferably a copper-aromatic polyamide structure, is stable at temperatures in excess of 500° F. for up to 1 minute. This is especially significant in view of the fact that in the manufacture of printed circuits electrical components are soldered with molten solder whose temperature is in the range of about 500° F. to 550° F. The molten solder quickly cools and solidifies so that in almost all cases the laminate is not exposed to these high temperatures for more than 1 minute.

Processes are also disclosed to produce the metal-polyamide of the instant invention. In accordance with a preferred process of the instant invention a solution of an aromatic polyamide is prepared comprising about 0.5 to 25 weight percent of an aromatic polyamide polymer dissolved in a powerful dipolar aprotic solvent. The aromatic polyamide solution or "dope" is coated or cast directly onto the desired metal substrate. The casting or coating operation is conducted at atmospheric pressure with the aromatic polyamide solution at a temperature in the range of about 15° C. to 200° C. The laminate is thereafter treated to remove the solvent from the formed polyamide film to produce the metal-polyamide laminate of the instant invention.

In an alternate preferred embodiment the metal-polyamide laminate of the instant invention is produced by the process which comprises casting an aromatic polyamide film from a polyamide solution comprising about 0.5 to 25 weight percent aromatic polyamide polymer dissolved in a powerful dipolar aprotic solvent. The polyamide solution is maintained at a temperature in the range of about 15° C. to 100° C. at atmospheric pressure during the casting operation. The formed aromatic polyamide film is dried by subjecting the film to a temperature in the range of about 100° F. to 450° F. for a period of about one minute to one hour to yield a film comprising 3 to 45 percent by weight of the solvent. The film, which is preferably cast on a substrate, is separated from the substrate. The film, containing 3 to 45% by weight of solvent, is bonded to a metal substrate, which may be in the form of a film, a molded article or the like. The bonding operation is preferably performed by pressing together the metal substrate, preferably copper, with the polyamide film under a pressure of about 25 to 1000 p.si.g. and a temperature in the range of about 150° F. to 450° F. The polyamide layer of the resultant adhesiveless polyamide-metal laminate is treated by methods known in the art to remove the remainder of solvent to produce the final metal-polyamide laminate of the instant invention.

DETAILED DESCRIPTION

The metal-polyamide structure of the instant invention is provided by a preferred process in which an aromatic polyamide layer is laminated to a metal substrate without an adhesive therebetween. The term "aromatic polyamide" refers to a polymer wherein aromatic radicals are linked to a carbonamide group, i.e., the

radical ($R_1$ selected from the group consisting of hydrogen and lower alkyl), the nitrogen and carbonyl of each repeating carbonamide radical being directly attached to a carbon atom in the ring of an aromatic radical; that is, the nitrogen and carbonyl of each repeating carbonamide group each replaces a hydrogen of an aromatic ring. The term "aromatic ring" means a carbocyclic ring possessing resonance. Exemplary aromatic radicals have the following structural formulas:

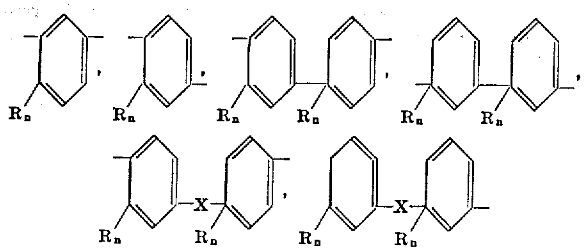

in which R is preferably a lower alkyl, lower alkoxy, or halogen group, *n* is a number from 0–4, inclusive, and X is preferably one of the groups of

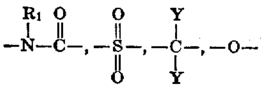

in which Y is a hydrogen or a lower alkyl group (R is defined above). X may also be a lower alkylene or lower alkylene dioxy group although these are somewhat less desirable. R may also be a nitro, lower carbalkoxy, or other non-polyamide-forming group. All of these aromatic radicals are divalent and meta or para oriented, i.e., the unsatisfied bonds of the radicals (the "intralinear bonds" when the radical is viewed in the repeating unit of the structural formula of the polymer) are meta or para oriented with respect to each other. One or more of the aromatic radicals may contain substituent groups as indicated and any aromatic ring may contain two or more of the same or different substituent groups. The total number of substituent groups or carbon atoms attached to any aromatic ring is desirably less than about four and preferably all the aromatic radicals are phenylene.

The high molecular weight polymers are prepared by reacting at low temperature (below 100° C.) an aromatic dicarboxylic acid halide, preferably the dichloride, with one or more aromatic diamines, preferably a mixture thereof. The amino groups of these aromatic compounds are preferably meta or para to each other, 50–80 percent by weight being in the meta position and the aromatic dicarboxylic acid halide is a compound with the acid halide groups positioned meta to each other. Any other wholly aromatic polyamides may be used, however.

Diacid chlorides of dibasic aromatic acids useful as reactants in preparing polymers of the present invention are compounds of the formula:

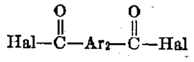

wherein $Ar_2$ is a divalent aromatic radical and Hal is a halogen atom of the class consisting of chlorine, bromine, and fluorine. The aromatic radical may have a single, multiple, or fused ring structure. One or more hydrogens of the aromatic nucleus may be replaced by non-polyamide-forming groups such as lower alkyl, lower alkoxy, halogen, nitro, sulfonyl, lower carbalkoxy, and the like. The terms "lower alkyl," "lower alkoxy" and "lower carbalkoxy" refer to groups containing less than five carbon atoms.

Diacid chlorides which may be utilized to prepare the aromatic polyamides of this invention include isophthaloyl chloride, terephthaloyl chloride, and lower alkyl and terephthaloyl chlorides, such as methyl, ethyl, propyl, etc., and terephthaloyl chlorides. There may be more than one alkyl group attached to the aromatic ring as in the case of dimethyl, trimethyl, tetramethyl, diethyl, triethyl, and tetraethyl and terephthaloyl chlorides. The most preferred reactant is isophthaloyl chloride.

The diamines useful as reactants in forming the polymer of this invention are compounds of the formula:

$$R_1—NH—Ar_1—NH—R_1$$

wherein $R_1$ is hydrogen or a lower alkyl, $Ar_1$ is a divalent aromatic radical, and the —NHR groups are preferably oriented meta or para with respect to each other. The diamines may contain single or multiple rings as well as fused rings. One or more hydrogens of the aromatic nucleus may be replaced by non-polyamide-forming groups such as lower alkyl, lower alkoxy, halogen, nitro, sulfonyl and lower carbalkoxy.

Exemplary diamines which may be utilized in this invention include meta or para-phenylene diamine and lower alkyl substituted derivatives thereof such as methyl, ethyl, propyl, and butyl meta or para-phenylene diamine, N,N'-dimethyl meta or para-phenylene diamine, N,N'-diethyl meta or para-phenylene diamine, etc. There may be more than one alkyl group attached to the aromatic ring as in the case of dimethyl, trimethyl, tetramethyl, diethyl, and triethyl, meta or para-phenylene diamine. The alkyl substituent groups need not be the same; thus compounds such as 2-methyl-4-ethyl meta or para-phenylene diamine and 2-methyl-4-ethyl-5-propyl meta or para-phenylene diamine may be utilized. In place of an alkyl group, the aromatic ring may be substituted with one or more lower alkoxy groups such as, for example, methoxy, ethoxy, propoxy, butoxy, meta or para-phenylene diamine. Other representative aromatic diamines which may be utilized include dimethoxy, trimethoxy, tetramethoxy and diethoxy-meta or para-phenylene diamine, and 2-methoxy-4-ethoxy meta or para-phenylene diamine. Halgen-substituted meta or para-phenylene diamine as exemplified by chloro, bromo, and fluoro meta or para-phenylene diamine may be utilized. More than one halogen may be attached to the aromatic ring. The halogens in these compounds may be the same or different as in the case of the dihalo compound. Other meta or para-phenylene diamines which may be used include nitro and lower carbalkoxy meta or para-phenylene diamines. One or more of the latter groups may be attached to the aromatic nucleus along with one or more alkyl, alkoxy or halogen groups. Mixtures of different diamine compounds may also be used. The most preferred reactants is a 70/30 molar mixture of meta and paraphenylene diamine.

The polymer product formed by the reaction of the aromatic dicarboxylic acid halide and the mixture of aromatic diamines has the following repeating structural unit:

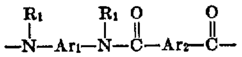

where $R_1$ is selected from the group consisting of hydrogen and lower alkyl, and $Ar_1$ and $Ar_2$ are divalent aromatic radicals. Preferably the intralinear polymer bonds are attached directly to non-adjacent carbon atoms in the respective aromatic rings, the bonds being positioned in the meta position in 50–80 percent of the $Ar_1$ radicals and in the para position in the remaining $Ar_1$ radicals. However, other wholly-aromatic polyamides may be formed and used in the instant invention.

After recovery of the aromatic polyamide polymer product, the polymer is dissolved in a solvent to form a polyamide polymer solution. The organic solvents which are generally utilized in forming of the polymer solution are powerful dipolar aprotic liquids. Typical of the dipolar aprotic liquids which are preferably employed as solvents in the formation of the polyamide solution are the following: N,N-dimethylacetamide, N-methyl pyrrolidone, N-cyclohexyl pyrrolidone, N-phenyl pyrrolidone, gramma-butyrolacetone, N,N'-dimethyl formamide, cyclopentanone, N,N'-diethyl acetamide, 2,6-lutdine, methylene chloride, hexamethylphosphoramides, dimethyl sulfoxide, N,N,N',N'-tetramethylenes, mixtures thereof and the like.

The polyamide polymer solution preferably comprises 0.5 to 25 percent by weight of the polyamide polymer and 75 to 99.5 percent by weight of the solvent. More preferably, the polymer solution comprises 15 to 20 percent by weight of the polyamide polymer and 80 to 85 percent by weight of the solvent.

The polyamide polymer solution is employed as the casting solution in the formation of solution cast aromatic polyamide film. During the casting operation the solution is maintained at a temperature in the range of about 15° C. to 100° C. and a pressure of 1 atmosphere.

In a preferred embodiment of the process of the instant invention the solution is cast directly onto the metal substrate, which is preferably copper. Other preferred metal substrates include aluminum and stainless steel. As will be appreciated by those skilled in the art, stainless steel is employed preferably in applications other than printed circuits. The metal substrate is preferably surface pretreated to enhance bonding to the aromatic polyamide polymer. Surface pretreatment comprises roughening of the metal surface. Typically, the metal substrate, usually in the form of a continuous sheet, is surface roughened by electrodeposition. Other surface roughening techniques, such as prepumicing, may also be employed.

The product, the polyamide polymer solution disposed upon the metal substrate, is transported into a heating means, preferably a vented oven, where the polyamide-metal laminate is exposed to a temperature in the range of about 100° F. to 450° F. for a period of from about 1 minute to 1 hour. During this period, the high boiling solvent concentration in the polyamide film is reduced to about 3 to 40 percent by weight and more preferably 10 to 25 percent by weight.

Further processing steps such as thermal treatment, infrared exposure, solvent extraction and combinations of the above processing techniques are employed to further reduce the solvent concentration in the polyamide film layer to less than 1 percent by weight.

The polyamide film layer, containing less than 1 percent by weight of solvent, and the metal substrate layer product of the above-described process comprises the polyamide-metal adhesiveless laminate of the instant invention.

In another preferred embodiment, the polyamide-metal laminate of the instant invention is prepared by a process in which the polyamide film is prepared separately by conventional casting techniques. In a preferred embodiment these casting procedures comprise casting on a substrate, preferably release paper or plastic film, preferably a polyester film, under conditions described above for the direct casting of the polyamide solution onto the metal substrate. Thus, the casting solution comprises the same composition as described for the direct casting of the aromatic polyamide onto metal and under similar temperature and pressure conditions.

The aromatic polyamide film resulting from this operation includes 3 to 40 percent by weight of the solvent. More preferably, the solvent concentration of the aromatic polyamide film is 10 to 25 percent by weight of the film. The solvent-included film is bonded to a metal substrate. Again, the metal is preferably selected from the group consisting of copper, aluminum and stainless steel, with copper most preferred. The metal substrate may take the form of a continuous sheet, a molded article or the like. As in the case of direct casting, the metal substrate is preferably surface treated to enhance bonding to the aromatic polyamide film. Surface treatment again is preferably electrodeposition or prepumicing.

The bonding operation is characterized by placing the metal substrate and the solvent-included aromatic polyamide film in intimate contact accompanied by the application of heat and pressure. Preferably, the metal substrate and aromatic polyamide film are bonded together by contacting the two layers at a temperature in the range of about 150° F. and 450° F. and a pressure of about 25 to 1000 p.s.i.g. More preferably, the temperature during bonding is in the range of about 250° F. to 350° F. at a pressure of about 400 to 600 p.s.i.g. In most applications metal sheet is used. In these cases a preferred contacting means comprises a pair of nip rolls which bonds the sheet and film layers together.

The resultant aromatic polyamide-metal adhesiveless structure is further processed to further reduce the solvent concentration to less than 1 percent by weight of the polyamide film layer. Again, this step is carried out by the following well known processing techniques: thermal heating, infrared heating, solvent extraction or combinations of these methods. The final product, an adhesiveless polyamide-metal laminate structure, is identical to the product produced by direct casting of the aromatic polyamide solution onto a metal substrate.

The following examples are presented to illustrate the instant invention. Since these examples are given by way of illustration, they should not be construed as limiting, in any way, the scope of the invention.

EXAMPLE 1

An aromatic polyamide polymer is formed by the reaction of equimolar ratios of isophthaloyl chloride and a 70:30 molar ratio of meta/para-phenyl diamine. The aromatic polyamide polymer formed, 70/30 meta/para phenylene diamine isophthalamide, is dissolved in a dipolar aprotic solvent, dimethylacetamide, to form a solution of which 15 percent by weight is the aromatic polyamide polymer. The solution, at a temperature of about 20° C., is cast onto a moving sheet of electrodeposited copper under atmospheric pressure conditions. The aromatic polyamide copper sheet is thereafter heated in a vented oven, maintained at a temperature of approximately 300° F. for about 10 minutes. The laminate including the polyamide film layer having a solvent concentration of about 15 percent by weight of the film is further processed to reduce the polyamide film layer solvent concentration to less than 1 percent by weight of the film.

EXAMPLE 2

A sample of the aromatic polyamide-copper laminate formed in Example 1 is subjected to the micro-knife adhesion test.[1] The sample, in which the polyamide film layer is 1 mil thick, yields a lateral stress of from 8 to 9 mils.

EXAMPLE 3

Another sample of the adhesiveless laminate of Example 1 is tested for tear or stripping strength. This is accomplished by subjecting the sample to the peel test. This test, ASTM D-903, measures peel strength in terms of pounds per inch of width. The test yields a peel strength of at least 10 lb./in. This result is superior to the peel strength attained by representative samples of aromatic polyamide-copper laminates containing an adhesive which has an average peel strength, measured by this test, of about 8 or 9 lbs./in.

EXAMPLE 4

Another sample of the same laminate comprising a 1 mil thick polyamide film layer non-adhesively bonded to surface treated copper, which is properly dried to remove sorbed water is exposed to molten solder at 550° F. The laminate did not distort or blister after 1 minute of this exposure.

EXAMPLE 5

A casting solution of 70/30 meta/para phenylene diamine isophthalamide in dimethyl acetamide is prepared by the method described in Example 1. The casting solution is cast onto a moving polyethylene terephthalate film substrate. The cast aromatic polyamide film on the polyethylene terephthalate substrate is heated in a vented oven to reduce the solvent concentration to about 20 percent by weight of the film. The polyamide film is then separated from the substrate.

An electrodeposited copper sheet is bonded to this aromatic polyamide film by contacting the copper sheet and aromatic polyamide film together through a pair of nip rolls maintained at a temperature and pressure of about 300° F. and 500 p.s.i.g. respectively. The resultant aromatic polyamide-copper laminate is thereafter treated by well known methods to reduce the solvent concentration in the aromatic polyamide layer to less than 1 percent by weight.

EXAMPLE 6

A sample of the aromatic polyamide-copper laminate formed in Example 5 is exposed to molten solder at 550° F. for 60 seconds. The laminate does not blister or distort.

EXAMPLE 7

An aromatic polyamide film, is formed by bonding together a layer of isophthalamide film containing less than 1 percent by weight of solvent and a layer of copper, with an adhesive of the type commonly employed, and well known in the art, disposed therebetween to hold the two layers together.

EXAMPLE 8

Several samples of the laminate formed in Example 7 are subjected to molten 550° F. solder for various time intervals ranging from a few seconds to 1 minute. In many cases, the samples blister and/or distort.

The above embodiments and examples illustrate the scope and spirit of the instant invention. Other embodiments and examples will become apparent to those skilled in the art. These embodiments and examples within the scope and spirit of this invention, are within the contemplation of this invention. Therefore, the instant invention should be limited only by the appended claims.

What is claimed is:

1. A process for forming an adhesiveless aromatic polyamide-metal laminate comprising the steps of:
   dissolving an aromatic polyamide polymer, said polymer having the repeating structural unit

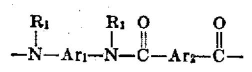

wherein $R_1$ is selected from the group consisting of hydrogen and lower alkyl, and $Ar_1$ and $Ar_2$ are divalent aromatic radicals, in a dipolar aprotic solvent to form an aromatic polyamide casting solution;
   casting said solution directly onto a metal substrate to form a polyamide-metal laminate; and reducing the solvent concentration in the aromatic polyamide layer of said laminate to less than 1 percent by weight.

2. A process in accordance with claim 1 wherein said aromatic polyamide polymer is 70/30 meta/para phenylene diamine isophthalamide.

3. A process in accordance with claim 1 wherein said casting solution comprises 0.5 to 25 percent by weight of said aromatic polyamide polymer.

4. A process in accordance with claim 1 wherein said metal is copper.

5. A process in accordance with claim 1 wherein said metal substrate is treated to provide a roughened surface.

6. A process in accordance with claim 5 wherein said metal surface is electrodeposited and surface treated.

7. A process for forming an adhesiveless aromatic polyamide-metal laminate comprising the steps of:
   dissolving an aromatic polyamide, said aromatic polyamide characterized by the repeating structure unit

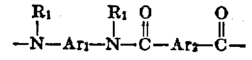

where $R_1$ is selected from the group consisting of hydrogen and lower alkyl, and $Ar_1$ and $Ar_2$ are divalent aromatic radicals, in a dipolar aprotic solvent to form an aromatic polyamide casting solution;
   casting said solution into an aromatic polyamide film, said film having a solvent concentration of 3 to 40 percent by weight;
   bonding said aromatic polyamide film to a metal substrate to produce a polyamide-metal laminate; and reducing the solvent concentration of said aromatic polyamide layer of said laminate to less than 1 percent by weight.

8. A process in accordance with claim 7 wherein said aromatic polyamide is 70/30 meta/para phenylene diamine isophthalamide.

9. A process in accordance with claim 7 wherein said aromatic polyamide casting solution comprises 0.5 to 25 percent by weight of aromatic polyamide polymer.

10. A process in accordance with claim 7 wherein said aromatic polyamide casting solution is cast onto a polyester film.

[1] The micro-knife adhesion test is fully described in "Paint Testing Manual—12th Edition" by Gardner and Sward, Gardner Lab. Inc., Bethesda, Md., 1962. Briefly it is an adhesion test in which lines are cut into the laminate. A parallel line is cut into the substrate a distance away from the first cut. The procedure is repeated until the minimum distance is found at which the coating layer of the laminate is raised between the two lines. The degree of adhesion of the layers of the laminate is proportional to this distance. The shorter the distance between the two lines for a constant thickness layer, the greater is the adhesion between the laminate layers. Although this result is reported in length units, it is a measure of the lateral stress (or adhesion) of the laminate layers. A lateral stress of 8 or 9 mils represents strong adhesion.

11. A process in accordance with claim 7 wherein said aromatic polyamide casting solution is cast onto release paper.

12. A process in accordance with claim 7 wherein said aromatic polyamide film is bonded to said metal substrate under a pressure in the range of about 25 to 1000 p.s.i.g. and at a temperature in the range of about 150° F. to 450° F.

13. A process in accordance with claim 7 wherein said metal substrate is copper.

14. A process in accordance with claim 7 wherein said aromatic polyamide film which is adhesivelessly bonded to said metal substrate includes 10 to 25 percent by weight of said solvent.

References Cited

UNITED STATES PATENTS

| | | | |
|---|---|---|---|
| 2,780,574 | 2/1957 | Ott et al. | 156—249 X |
| 3,585,010 | 6/1971 | Luce et al. | 156—151 X |
| 2,842,473 | 7/1958 | Oberly et al. | 156—246 |
| 2,970,077 | 1/1961 | Groves | 156—308 |
| 3,580,771 | 5/1971 | Maffitt | 156—246 X |
| 3,713,938 | 1/1973 | Sutton | 156—246 |
| 3,723,241 | 3/1973 | Rakus et al. | 161—227 |

HAROLD ANSHER, Primary Examiner

U.S. Cl. X.R.

117—49, 132 C, 161 P; 156—153, 249, 306; 161—214, 406; 264—216, 299